United States Patent
Edmond et al.

(10) Patent No.: US 9,484,499 B2
(45) Date of Patent: *Nov. 1, 2016

(54) TRANSPARENT OHMIC CONTACTS ON LIGHT EMITTING DIODES WITH CARRIER SUBSTRATES

(75) Inventors: John A. Edmond, Cary, NC (US); David B. Slater, Jr., Durham, NC (US); Michael J. Bergmann, Chapel Hill, NC (US)

(73) Assignee: CREE, INC., Durham, NC (US)

( * ) Notice: Subject to any disclaimer, the term of this patent is extended or adjusted under 35 U.S.C. 154(b) by 670 days.

This patent is subject to a terminal disclaimer.

(21) Appl. No.: 11/738,171

(22) Filed: Apr. 20, 2007

(65) Prior Publication Data

US 2008/0258161 A1    Oct. 23, 2008

(51) Int. Cl.
| | |
|---|---|
| *H01L 33/00* | (2010.01) |
| *H01L 33/42* | (2010.01) |
| *H01L 33/20* | (2010.01) |
| *H01L 33/22* | (2010.01) |

(52) U.S. Cl.
CPC ........... *H01L 33/42* (2013.01); *H01L 33/0079* (2013.01); *H01L 33/20* (2013.01); *H01L 33/22* (2013.01)

(58) Field of Classification Search
CPC ... H01L 33/42; H01L 33/0079; H01L 33/22; H01L 33/20
USPC ........... 257/98, E33.025, E33.058, E33.064, 257/E33.068, E33.074
See application file for complete search history.

(56) References Cited

U.S. PATENT DOCUMENTS

| | | |
|---|---|---|
| 4,214,251 A | 7/1980 | Schairer |
| 4,860,069 A | 8/1989 | Yamazaki |
| 4,894,703 A | 1/1990 | Hamamsy et al. |
| 5,077,587 A | 12/1991 | Albergo et al. |
| 5,113,233 A | 5/1992 | Kitagawa et al. |
| 5,214,306 A | 5/1993 | Hashimoto |
| 5,334,865 A | 8/1994 | Fathimulla et al. .......... 257/192 |
| RE34,861 E | 2/1995 | Davis et al. |
| 5,393,993 A | 2/1995 | Edmond et al. |
| 5,404,282 A | 4/1995 | Klinke et al. |
| 5,416,342 A | 5/1995 | Edmond et al. |

(Continued)

FOREIGN PATENT DOCUMENTS

| | | |
|---|---|---|
| CN | 1816917 | 8/2006 |
| DE | 102007019776 | 10/2008 |

(Continued)

OTHER PUBLICATIONS

Merriam Webster OnLine Definiton of "adjacent."*

(Continued)

*Primary Examiner* — Hrayr A Sayadian
(74) *Attorney, Agent, or Firm* — Koppel, Patrick, Heybl & Philpott

(57) ABSTRACT

A light emitting diode is disclosed that includes an active structure formed of at least p-type and n-type epitaxial layers of Group III nitride on a conductive carrier substrate. A conductive bonding system joins the active structure to the conductive carrier substrate. A first transparent ohmic contact is on the active structure adjacent the conductive carrier substrate, a second transparent ohmic contact is on the active structure opposite the conductive carrier substrate, and a third ohmic contact is on the conductive carrier substrate opposite from the active structure.

46 Claims, 2 Drawing Sheets

(56) References Cited

U.S. PATENT DOCUMENTS

| | | | |
|---|---|---|---|
| 5,500,381 A | 3/1996 | Yoshida et al. | 438/172 |
| 5,523,589 A | 6/1996 | Edmond et al. | |
| 5,550,091 A | 8/1996 | Fukuda et al. | |
| 5,563,422 A | 10/1996 | Nakamura et al. | |
| 5,567,523 A | 10/1996 | Rosenblum et al. | |
| 5,578,839 A | 11/1996 | Nakamura et al. | |
| 5,583,351 A | 12/1996 | Brown et al. | |
| 5,585,648 A | 12/1996 | Tischler | |
| 5,592,501 A | 1/1997 | Edmond et al. | |
| 5,616,937 A | 4/1997 | Kitagawa et al. | |
| 5,652,434 A | 7/1997 | Nakamura et al. | |
| 5,708,280 A | 1/1998 | Lebby et al. | |
| 5,739,554 A | 4/1998 | Edmond et al. | |
| 5,767,581 A | 6/1998 | Nakamura et al. | |
| 5,798,537 A * | 8/1998 | Nitta | 257/103 |
| 5,812,105 A | 9/1998 | Van de ven | |
| 5,813,752 A | 9/1998 | Singer et al. | |
| 5,877,558 A | 3/1999 | Nakamura et al. | |
| 5,959,401 A | 9/1999 | Asami et al. | |
| 5,990,531 A | 11/1999 | Taskar et al. | 257/410 |
| 6,130,446 A | 10/2000 | Takeuchi et al. | 257/99 |
| 6,197,609 B1 | 3/2001 | Tsutsui et al. | |
| 6,258,617 B1 | 7/2001 | Nitta et al. | |
| 6,344,663 B1 | 2/2002 | Slater, Jr. et al. | |
| 6,380,564 B1 * | 4/2002 | Chen | H01L 33/42 257/94 |
| 6,380,569 B1 | 4/2002 | Chang | 257/94 |
| 6,445,007 B1 | 9/2002 | Wu et al. | |
| 6,459,100 B1 | 10/2002 | Doverspike et al. | |
| 6,524,971 B1 | 2/2003 | Fetter et al. | |
| 6,586,781 B2 | 7/2003 | Wu et al. | |
| 6,586,813 B2 | 7/2003 | Nagahara | 257/472 |
| 6,717,362 B1 | 4/2004 | Lee et al. | |
| 6,791,119 B2 | 9/2004 | Slater, Jr. et al. | |
| 6,825,501 B2 | 11/2004 | Edmond et al. | |
| 6,869,812 B1 | 3/2005 | Liu | |
| 6,885,036 B2 | 4/2005 | Tarsa et al. | 257/99 |
| 6,888,171 B2 | 5/2005 | Liu et al. | 257/99 |
| 6,946,682 B2 | 9/2005 | Slater et al. | |
| 7,026,659 B2 | 4/2006 | Slater, Jr. et al. | |
| 7,049,639 B2 | 5/2006 | Wang | 257/698 |
| 7,141,825 B2 | 11/2006 | Horio et al. | 257/79 |
| 7,259,402 B2 | 8/2007 | Edmond et al. | |
| 7,473,938 B2 | 1/2009 | Edmond et al. | |
| 7,608,497 B1 | 10/2009 | Milosavljevic et al. | 438/182 |
| D631,020 S | 1/2011 | Chuang | D13/180 |
| D646,643 S | 10/2011 | Wu | D13/180 |
| D658,139 S | 4/2012 | Andrews | D13/180 |
| D675,169 S | 1/2013 | Chou | D13/180 |
| 8,368,100 B2 | 2/2013 | Donofrio | 257/79 |
| D691,973 S | 10/2013 | Donofrio | D13/180 |
| D693,781 S | 11/2013 | Kobayashi | D13/180 |
| D694,201 S | 11/2013 | Iino | D13/180 |
| D698,323 S | 1/2014 | Noichi | D13/180 |
| D709,464 S | 7/2014 | Abare | D13/180 |
| D710,810 S | 8/2014 | Noichi | D13/180 |
| D713,804 S | 9/2014 | Britt | D13/180 |
| 8,835,959 B2 * | 9/2014 | Nakamura | H01L 33/22 257/103 |
| D718,725 S | 12/2014 | Reiherzer | D13/180 |
| D741,821 S | 10/2015 | Song | D13/180 |
| D746,240 S | 12/2015 | Bergmann | D13/180 |
| 2001/0023964 A1 | 9/2001 | Wu et al. | |
| 2002/0017648 A1 | 2/2002 | Kasahara et al. | 257/79 |
| 2002/0030194 A1 | 3/2002 | Camras et al. | |
| 2002/0195609 A1 | 12/2002 | Yoshitake | |
| 2003/0062530 A1 | 4/2003 | Okazaki et al. | |
| 2003/0141506 A1 | 7/2003 | Sano et al. | 257/78 |
| 2003/0227250 A1 * | 12/2003 | Nee | C22C 5/06 313/495 |
| 2004/0135166 A1 | 7/2004 | Yamada | |
| 2004/0208216 A1 * | 10/2004 | Naone et al. | 372/45 |
| 2005/0082562 A1 | 4/2005 | Ou et al. | |
| 2005/0095737 A1 | 5/2005 | Edmond et al. | |
| 2005/0211989 A1 | 9/2005 | Horio et al. | 257/79 |
| 2005/0236636 A1 * | 10/2005 | Hon et al. | 257/99 |
| 2005/0242364 A1 * | 11/2005 | Moustakas | B82Y 20/00 257/103 |
| 2005/0258431 A1 | 11/2005 | Smith et al. | 257/79 |
| 2005/0258450 A1 | 11/2005 | Saxler | 257/192 |
| 2005/0258451 A1 | 11/2005 | Saxler et al. | 257/192 |
| 2006/0006414 A1 | 1/2006 | Germain et al. | 257/192 |
| 2006/0006554 A1 | 1/2006 | Yoo et al. | |
| 2006/0060874 A1 | 3/2006 | Edmond et al. | |
| 2006/0060877 A1 * | 3/2006 | Edmond et al. | 257/99 |
| 2006/0071228 A1 * | 4/2006 | Sun | 257/99 |
| 2006/0091405 A1 | 5/2006 | Kwak | |
| 2006/0094145 A1 | 5/2006 | Otsuka et al. | |
| 2006/0108606 A1 | 5/2006 | Saxler et al. | 257/200 |
| 2006/0131599 A1 | 6/2006 | Slater, Jr. et al. | |
| 2006/0154392 A1 * | 7/2006 | Tran et al. | 438/22 |
| 2006/0175628 A1 | 8/2006 | Otsuka et al. | |
| 2006/0186418 A1 | 8/2006 | Edmond et al. | |
| 2006/0202217 A1 | 9/2006 | Ro et al. | |
| 2006/0273336 A1 | 12/2006 | Fujikura et al. | |
| 2007/0018180 A1 | 1/2007 | Lai et al. | |
| 2007/0037307 A1 | 2/2007 | Donofrio | |
| 2007/0102692 A1 | 5/2007 | Asahara et al. | |
| 2007/0114515 A1 | 5/2007 | Aoyagi et al. | |
| 2007/0200493 A1 * | 8/2007 | Hsu | H01L 33/42 313/506 |
| 2008/0003777 A1 | 1/2008 | Slater et al. | |
| 2008/0064133 A1 | 3/2008 | Lee et al. | 438/29 |
| 2008/0073665 A1 | 3/2008 | Slater et al. | |
| 2008/0083206 A1 | 4/2008 | Edmond et al. | |
| 2008/0197378 A1 | 8/2008 | Kong et al. | |
| 2008/0203541 A1 | 8/2008 | Makiyama | 257/640 |
| 2008/0217635 A1 | 9/2008 | Emerson et al. | |
| 2008/0258161 A1 * | 10/2008 | Edmond | H01L 33/42 257/98 |
| 2008/0290364 A1 | 11/2008 | Kamiya et al. | |
| 2008/0308832 A1 | 12/2008 | Hsieh et al. | |
| 2009/0050907 A1 | 2/2009 | Yuan | 257/88 |
| 2009/0108281 A1 | 4/2009 | Keller | 257/98 |
| 2009/0121241 A1 | 5/2009 | Keller et al. | 257/96 |
| 2013/0105835 A1 | 5/2013 | Wu | 257/89 |
| 2013/0328074 A1 | 12/2013 | Lowes | 257/89 |

FOREIGN PATENT DOCUMENTS

| | | |
|---|---|---|
| DE | 102007046743 | 4/2009 |
| EP | 0357458 | 3/1990 |
| EP | 0404565 | 12/1990 |
| EP | 0622858 | 11/1994 |
| EP | 1052705 | 11/2000 |
| EP | 1278249 | 1/2003 |
| EP | 1486818 A | 12/2004 |
| JP | 57042179 | 3/1982 |
| JP | 61141185 | 6/1986 |
| JP | 07307489 | * 11/1995 |
| JP | 07-326823 | 12/1995 |
| JP | 08111544 | 4/1996 |
| JP | 09139515 | 5/1997 |
| JP | 09-191160 | 7/1997 |
| JP | 10189649 | 7/1998 |
| JP | 11150298 | 6/1999 |
| JP | 2001514451 | 9/2001 |
| JP | 2002026385 | 1/2002 |
| JP | 2002353499 | 12/2002 |
| JP | 2003133590 | 5/2003 |
| JP | 2003347589 | 12/2003 |
| JP | 200447988 A | 2/2004 |
| JP | 2004047988 | 2/2004 |
| JP | 3105430 | 10/2004 |
| JP | 3105430 U | 10/2004 |
| JP | 200517289 A | 7/2005 |
| JP | 2005244152 | 9/2005 |
| JP | 2005268601 | 9/2005 |
| JP | 2005123489 | 12/2005 |
| JP | 2006066903 | 3/2006 |
| JP | 2006128631 | 5/2006 |
| JP | 2006128727 | 5/2006 |
| JP | 2006313888 | 11/2006 |
| JP | 2007073965 | 3/2007 |

(56) References Cited

FOREIGN PATENT DOCUMENTS

| JP | 2008112957 | 5/2008 |
|---|---|---|
| JP | 2008112957 A | 5/2008 |
| JP | 2008288548 | 11/2008 |
| JP | 2008288548 A | 11/2008 |
| JP | 2009049342 | 3/2009 |
| JP | 200988299 | 4/2009 |
| TW | 564584 | 12/2003 |
| TW | 200627674 | 8/2006 |
| TW | 200627675 | 8/2006 |
| TW | I286394 B | 9/2007 |
| WO | 96/24167 | 8/1996 |
| WO | 99/10936 | 3/1999 |
| WO | WO9910936 | 3/1999 |
| WO | 2006006556 | 1/2006 |
| WO | WO 2006006555 | 1/2006 |
| WO | WO2006011672 | 2/2006 |
| WO | WO 2007/029842 A | 3/2007 |
| WO | WO 2007141763 | 12/2007 |
| WO | 2008130821 | 10/2008 |

OTHER PUBLICATIONS

English Abstract of Kawamoto.*
Ishikawa et al.; "Effects of Surface Treatments and Metal Work Functions on Electrical Properties at p-GaN/Metal Interfaces," J. Appl. Phys., vol. 81, No. 3, Feb. 1, 1997, pp. 1315-1322.
SZE—Physics of Semiconductor Materials, 2nd Edition (1981), pp. 697-700.
Jong et al., "Enhancement of Light Extraction in GaInN Light-Emitting Diodes with Graded-Index Indium Tin Oxide Layer," 2007 Conference on Lasers and Electro-Optics, May 5-11, 2007, Baltimore, MD, pp. 1325-1326.
International Search Report of related foreign counterpart application No. PCT/US2008/059381; mailing date Feb. 13, 2009; pp. 3.
International Search Report of foreign counterpart International Application No. PCT/US2008/059390 mailed Aug. 22, 2008, 4 pages.
Notice of Rejection from Japanese Patent Application No. 2010-504160, dated Feb. 21, 2012.
Second Office Action from Chinese Patent Application No. 200880020777.7, dated Feb. 16, 2012.
Notice of Rejection of Japanese Application No. 2010-504160, dated Jan. 30, 2012.
Notification of First Office Action in counterpart Chinese Patent Application No. 200880020777.7 dated Dec. 24, 2010.
Office Action in counterpart Taiwan Patent Application No. 097114378 issued Oct. 24, 2011.
Interrogation from Japanese Patent Application No. 2009-132243, dated Apr. 23, 2013.
Office Action from Taiwanese Patent Application No. 097114378, dated: Jul. 12, 2012.
Third Office Action from Chinese Patent Application No. 200880020777.7, dated Sep. 6, 2012.
Decision of Rejection from Japanese Patent Application No. 2010-504160, dated Dec. 25, 2012.
Fourth Office Action from Chinese Patent Appl. No. 200880020777.7, dated Feb. 17, 2013.
Decision of Dismissal of Amendment from Japanese Patent Appl. No. 2012-510802, dated Feb. 18, 2014.
Notice of Reasons for Rejection from Japanese Patent Application No. 2012-510802, dated May 21, 2013.
First Office Action from Chinese Patent Appl. No. 201080026730.9, dated Oct. 23, 2013.
Office Action from Taiwanese Patent Appl. No. 097114378, dated May 12, 2014.
Office Action from U.S. Appl. No. 11/904,064, dated May 2, 2014.
Office Action from U.S. Appl. No. 11/904,064, dated Jul. 26, 2012.
Response to OA from U.S. Appl. No. 11/904,064, filed Jan. 28, 2013.
Office Action from U.S. Appl. No. 12/432,478, dated Jun. 20, 2012.
Response to OA from U.S. Appl. No. 12/432,478, filed Aug. 17, 2012.
Office Action from U.S. Appl. No. 12/185,031, dated Jun. 12, 2012.
Response to OA from U.S. Appl. No. 12/185,031, filed Aug. 24, 2012.
Office Action from U.S. Appl. No. 11/904,064, dated Feb. 25, 2013.
Response to OA from U.S. Appl. No. 11/904,064, filed May 24, 2013.
Office Action from U.S. Appl. No. 11/904,064, dated Jun. 12, 2013.
Response to OA from U.S. Appl. No. 11/904,064, filed Aug. 20, 2013.
Office Action from U.S. Appl. No. 13/023,788, dated Mar. 12, 2013.
Response to OA from U.S. Appl. No. 13/023,788, filed Jun. 11, 2013.
Office Action from U.S. Appl. No. 12/432,478, dated Jul. 1, 2013.
Office Action from U.S. Appl. No. 13/023,788, dated Jul. 2, 2013.
Rejection Decision from Chinese Patent Appl. No. 200880020777.7, dated Jul. 3, 2013.
Interrogatory from Japanese Patent Appl. No. 2010-504160, dated Jul. 16, 2013.
Preliminary Examination Report from Japanese Patent Appl. No. 2010-504160, dated Jun. 25, 2013.
Second Office Action from Chinese Patent Appl. No. 201080026730.9 dated Apr. 9, 2014.
Office Action from U.S. Appl. No. 11/904,064, dated Sep. 12, 2013.
Response to OA from U.S. Appl. No. 11/904,064, filed Nov. 11, 2013.
Office Action from U.S. Appl. No. 11/904,064, dated Jan. 7, 2014.
Notice of Reasons for Rejection from Japanese Patent Appl. No. 2009-132243, dated Oct. 1, 2013.
Office Action from Japanese Patent Appl. No. 2012-510802, dated Oct. 8, 2013.
Trial Decision from Japanese Patent Appl. No. 2012-510802, dated Jul. 21, 2015.
Office Action from U.S. Appl. No. 14/159,209, dated Jun. 2, 2015.
Pretrial Report from Japanese Patent Appl. No. 2012-510802, dated Jul. 2, 2014.
Notification of the Fifth Office Action from Chinese Patent Appl. No. 200880020777.7, dated Jan. 21, 2015.
Office Action from U.S. Appl. No. 14/159,209, dated Nov. 17, 2015.
Second Examination from European Patent Appl. No. 09 159 460.6-1552, dated Feb. 10, 2016.
Office Action from U.S. Appl. No. 29/511,587; Apr. 5, 2016.
Steigerwald, Daniel A., et al; A GaInN Flip Chip Light Emitting Device Having High Reflectance Ohmic Contact; Nov. 22, 2002; Japanese Application No. 2002-33014.
Office Action for Application No. 2015-130167; Dated Mar. 9, 2016.
Allowance Decision from Taiwanese Patent Appl. No. 097114378, dated Sep. 5, 2014.
Certificate of Patent for Invention from Chinese Patent Appl. No. ZL200880020777.7, dated Aug. 5, 2015.
Foreign Office Action for European Appl. No. 8745097.9; Dated Jul. 25, 2016.
W.H. Southwell: (Gradient-index antireflection coatings, OPTICAL LETTERS, vol. 8, No. 11, Nov. 1, 1983 (Nov. 1, 1983), p. 584.

* cited by examiner

TRANSPARENT OHMIC CONTACTS ON LIGHT EMITTING DIODES WITH CARRIER SUBSTRATES

RELATED APPLICATIONS

This is related to copending and commonly assigned application Ser. No. 11/738,122 filed concurrently herewith for "Transparent Ohmic Contacts on Light Emitting Diodes with Growth Substrates."

BACKGROUND

The present invention relates to light emitting diodes and in particular relates to increasing the external quantum efficiency of light emitting diodes in which a growth substrate has been partially or entirely removed, and a carrier substrate has been added.

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

Light emitting diodes share a number of the favorable characteristics of other semiconductor devices. These include generally robust physical characteristics, long lifetime, high reliability, and, depending upon the particular materials, low cost.

A number of terms are used herein that are common and well-understood in the industry. In such industry use, however, these terms are sometimes informally blended in their meaning. Accordingly, these terms will be used as precisely as possible herein, but in every case their meaning will be clear in context.

Accordingly, the term "diode" or "chip" typically refers to the structure that minimally includes two semiconductor portions of opposite conductivity types (p and n) along with some form of ohmic contacts to permit current to flow across the resulting p-n junction when a potential difference is applied.

The term "lamp" is used to designate a light emitting diode that is matched with an appropriate mechanical support and electrical contact and potentially a lens to form a discrete device that can be added to or included in electrical circuits or lighting fixtures or both.

As used herein, the term "package" typically refers to the placement of the semiconductor chip on an appropriate physical and electrical structure (sometimes as simple as a small piece of metal through which the electrical current is applied) along with a plastic lens (resin, epoxy, encapsulant) that provides some physical protection to the diode and can optically direct the light output.

Appropriate references about the structure and operation of light emitting diodes and diode lamps include Sze, PHYSICS OF SEMICONDUCTOR DEVICES, 2d Edition (1981) and Schubert, LIGHT-EMITTING DIODES, Cambridge University Press (2003).

The color emitted by an LED is largely defined by the material from which it is formed. Diodes formed of gallium arsenide (GaAs) and gallium phosphide (GaP) tend to emit photons in the lower energy (yellow, red, infrared) portions of the spectrum. Materials such as silicon carbide (SiC) and the Group III nitrides have larger bandgaps and thus can generate photons with greater energy that appear in the green, blue, violet and ultraviolet portions of the electromagnetic spectrum.

In some applications, an LED is more useful when its output is moderated or converted to a different color. As the availability of blue-emitting LEDs has greatly increased, the incorporation of yellow-emitting phosphors that down-convert the blue photons has likewise increased. The combination of the blue light emitted by the diode and the yellow light emitted by the phosphor can create white light. In turn, the availability of white light from solid-state sources provides the capability to incorporate them in a number of applications, particularly including illumination and as lighting (frequently backlighting) for color displays. In such devices (e.g., flat computer screens, personal digital assistants, and cell phones), the blue LED and yellow phosphor produce white light which is then distributed in some fashion to illuminate the color pixels. Such color pixels are often formed by a combination of liquid crystals, color filters and polarizers, and the entire unit including the backlighting is generally referred to as a liquid crystal display ("LCD").

As the use of light emitting diodes has commercially increased and as the understanding of the basic characteristics of diodes used to produce white light has matured, the advances of interest in the technology tend to be those that increase the total amount of light that is produced by a given diode structure, all other factors being equal.

In this regard, the number of individual photons produced by a diode in any given amount of time depends upon the number of recombination events occurring in the diode, with the number of photons generally being less than the number of recombination events (i.e., not every event produces a photon). In turn, the number of recombination events depends upon the amount of current applied across the diode. Once again the number of recombination events will typically be less than the number of electrons injected across the junction. Thus, these electronic properties can reduce the external output of the diode.

Additionally, when photons are produced, they must also actually leave the diode and the lamp to be perceived by an observer. Although many photons will leave the lamp without difficulty, a number of well-understood effects prevent some fraction of the photons from leaving. These effects arise from the difference in refractive index of the various materials within the diode, and thus reduce the external output of an LED lamp (i.e., its efficiency). These include internal reflection of a photon until it attenuated and emitted or absorbed (i.e., Snell's Law and Fresnel Loss) rather than emitted. The difference in the index of refraction between the materials in the diode can also change the direction of an emitted photon (Snell's Law) towards an object that subsequently attenuates or absorbs it. The same results can occur for yellow photons that are emitted by the phosphor in a phosphor-containing LED lamp. In an LED lamp such "objects" can include the substrate, parts of the packaging, and the metal contact layers. Indeed, the same quantum mechanical characteristics that permit semiconductor materials to emit photons will also cause them to absorb photons. Thus, even the light emitting epitaxial layers in an LED can absorb emitted photons and reduce the overall external efficiency of the diode.

Many semiconductor devices, including many light emitting diodes, consist in basic form of a semiconductor substrate and epitaxial layers of semiconductor materials on the substrate. The epitaxial layers often (although not necessarily exclusively) form the active portions of the device. They are generally favored for this purpose because they are grown in a manner (frequently chemical vapor deposition) that increases both their chemical purity and produces a highly ordered crystal structure. Additionally, chemical vapor deposition provides an excellent technique for precisely doping an epitaxial layer. In turn, the appropriate purity, crystal structure and doping are typically desired or necessary for successful operation of the semiconductor device.

The chemical vapor deposition (CVD) and related techniques used to fabricate epitaxial layers are, however, generally more time-consuming than other crystal growth techniques such as sublimation or growth from a melt (sometimes referred to as bulk growth). As a result, these more rapid (comparatively) methods are often used to produce an appropriate crystal when the intended structure is other than an epitaxial layer.

Thus, by combining a bulk-growth substrate with epitaxial layers, an overall structure can be produced with a reasonable combination of crystal structure, compositional purity, doping, and efficient fabrication.

Nevertheless, for several crystal growth-related reasons, bulk (i.e., reasonably large size) single crystals of Group III nitrides are, for practical purposes, unavailable. Accordingly, Group IIII nitride LEDs are typically formed on other bulk substrate materials, most commonly sapphire ($Al_2O_3$) and silicon carbide (SiC). Sapphire is relatively inexpensive, widely available, and highly transparent. Alternatively, sapphire is a poor thermal conductor and therefore less suitable for certain high-power applications. Additionally, in some devices, electrically conductive substrates are preferred and sapphire is insulating rather than conductive. Sapphire also carries a lattice mismatch with (for example) gallium nitride of about 16%.

Silicon carbide has a better thermal conductivity than sapphire and a better lattice match with Group IIII nitrides; i.e., a mismatch of about 3.5% with gallium nitride and only about 1% with aluminum nitride. Silicon carbide can be conductively doped, but is also much more expensive than sapphire.

Although silicon carbide offers advantages for the growth of Group III nitride epitaxial layers, there are other reasons that encourage the use of other substrate materials in the final diodes. In order to use such other materials, the growth substrate (typically silicon carbide) must be partially or entirely removed and a carrier substrate must be added.

Depending upon the function and use of the final diode, the use of such carrier substrates offers several advantages. As one, the thickness required for a growth substrate during the diode fabrication steps may not be required in the final diode. By removing the growth substrate and replacing it with the carrier substrate, the overall thickness of the diode can be advantageously reduced. This is described in, for example, co-pending and commonly assigned application Ser. No. 10/951,042 filed Sep. 22, 2004 for "High Efficiency Group III Nitride-Silicon Carbide Light Emitting Diode."

As another advantage, replacing the growth substrate with the carrier substrate often results in positioning the carrier substrate on the opposite side of the active layers from the growth substrate. For example, silicon carbide growth substrates are frequently n-type. Thus, the first epitaxial layer grown on the silicon carbide substrate is frequently an n-type Group III nitride layer. The p-type layer is then grown on top of the n-type layer.

The carrier substrate is then typically added to the p-type layer to form an intermediate structure having both substrates (growth and carrier). When the growth substrate is removed from the n-type layer, the carrier substrate remains attached to the p-type layer. The resulting structure has a carrier substrate, a p-type layer on the carrier substrate, and an n-type layer as the portion opposite the carrier substrate.

Although p-type layers are necessary for producing p-n junctions and junction characteristics, the conductivity of p-type Group III nitride materials is comparatively lower than that of n-type layers. As a result, it can be difficult to obtain a desired amount of current spreading in a p-type layer.

By using a carrier substrate, the epitaxial layers can be flipped and the p-type layer can be conductively mounted to the carrier substrate and the n-type layer can form the emitting face of the diode. In this orientation the higher conductivity of the n-type layer offers advantages in lateral current flow and thus light extraction.

As yet another advantage, and although the observation to date has been empirical, increased brightness has been observed from Group III nitride light emitting diodes in which the epitaxial layers are grown on silicon carbide and after which the silicon carbide substrate is removed and replaced with a carrier substrate.

Copending and commonly assigned application Ser. No. 11/338,918 filed Jan. 25, 2006 and now published as No. 20060131599 offers some additional explanations and considerations as to how the substrate can affect the overall device performance.

A carrier substrate can also provide a structure that is more amenable than a silicon carbide substrate to certain soldering techniques or other later fabrication steps.

In other cases, the working diode in context does not require the thermal or electronic or optical properties of silicon carbide. In such cases silicon carbide offers advantages for growth, but not for use. This differs, of course, from certain power devices in which the intrinsic semiconductor characteristics of silicon carbide are the relevant property. Growing Group III nitride epitaxial layers on silicon carbide and then removing the silicon carbide substrate can reduce the overall cost of the resulting diodes, because the removed silicon carbide substrate (which typically is used as a wafer and then is removed as a wafer) can be reused. Thus, although silicon carbide is comparatively more expensive than sapphire or other substrate materials, reusing it in this fashion moderates the cost of fabrication while providing the growth advantages of SiC for Group III nitride epilayers.

For at least these reasons, producing Group III nitride light emitting diodes on carrier substrates after growth substrates have been removed remains of significant interest and drives a desire for continuing improvements in the technology. Additionally, increasing the external quantum efficiency of light emitting diodes within the context of such carrier substrate structures remains a continuing goal.

SUMMARY

In one aspect, the invention is light emitting diode that includes an active structure formed of at least p-type and n-type epitaxial layers of Group III nitride, a conductive carrier substrate, a conductive bonding system joining the active structure to the conductive carrier substrate, a first transparent ohmic contact to the active structure adjacent the conductive carrier substrate, a second transparent ohmic contact to the active structure opposite the conductive carrier substrate, and a third ohmic contact to the conductive carrier substrate opposite from the active structure.

In another aspect, the invention is a light emitting diode that includes a conductive carrier substrate, a p-type Group III nitride epitaxial layer on the conductive carrier substrate, a first transparent ohmic contact to the p-type layer and between the p-type layer and the conductive carrier substrate, an n-type gallium nitride epitaxial layer on the p-type gallium nitride layer, a lenticular surface on the n-type gallium nitride epitaxial layer, a second transparent ohmic contact substantially covering the n-type epitaxial layer and the lenticular surface, with the second transparent ohmic contact forming a lenticular surface opposite the n-type epitaxial layer, and a third ohmic contact to the carrier substrate opposite from the Group III nitride layers.

In yet another aspect the invention is a light emitting diode lamp that includes a header, a light emitting diode on the header, with the diode including at least an active structure of n-type and p-type layers of Group III nitride, respective transparent ohmic contact layers on opposite sides of the active structure, a conductive carrier substrate, and an ohmic contact between the conductive carrier substrate and the header, and an encapsulant covering the light emitting diode on the header and portions of the header.

In yet another aspect the invention is a display that includes a light emitting diode lamp, a light diffuser adjacent the lamp, a plurality of liquid crystals adjacent the diffuser, and color filters.

The foregoing and other objects and advantages of the invention and the manner in which the same are accomplished will become clearer based on the followed detailed description taken in conjunction with the accompanying drawings.

DETAILED DESCRIPTION

Figure 1:
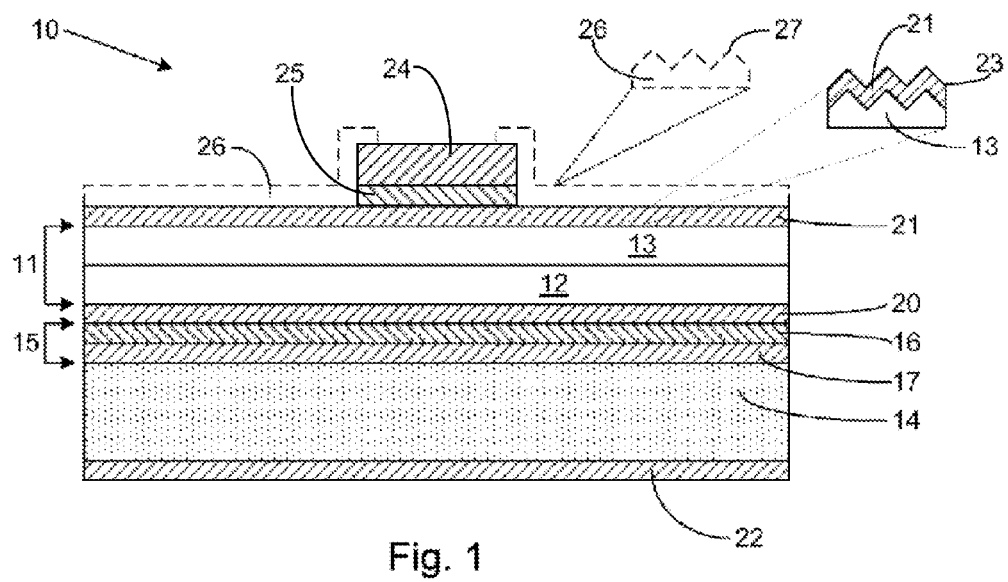
FIGS. 1 and 2 are cross-sectional schematic diagrams of light emitting diodes according to the present invention.

FIG. 1 illustrates a first embodiment of the diode according to the present invention broadly designated at 10. The diode 10 includes an active structure designated by the brackets 11 that is formed of at least one p-type Group III nitride epitaxial layer 12 and one n-type Group III nitride epitaxial layer. The nature and fabrication of Group III nitride epitaxial layers is generally well understood in this art and will not be otherwise described in detail. Generally (although not exclusively), light emitting layers are formed of gallium nitride (GaN) or indium gallium nitride ($In_xGa_{1-x}N$), with layers of aluminum gallium nitride ($Al_xGa_{1-x}N$) used in certain circumstances such as buffer layers. Although FIG. 1 illustrates the light emitting active structure 11 as a straightforward p-n junction between one p-type layer 12 and one n-type layer 13, it will be understood that the active structure 11 could include additional layers such as a quantum well, multiple quantum wells, or single or double heterostructures. Again, these are well understood in the art and will not be described in detail.

The diode 10 includes a conductive carrier substrate 14. The carrier substrate 14 can be any material that can be conductively doped (or is conductive, such as a metal), that is compatible with normal fabrication steps and that will otherwise support and complement the operation of the light emitting active structure 11. Appropriate conductive carrier structures include silicon and silicon carbide, as well as any other material that otherwise meets the noted qualifications.

Because the carrier substrate 14 is not the original growth substrate, a conductive bonding system indicated by the brackets 15 joins the active structure 11 to the conductive carrier substrate 14. FIG. 1 illustrates the bonding system as two metal layers 16 and 17 respectively, but it will be understood that in some cases a single layer may be appropriate while another circumstances, a larger number of layers can provide advantages. Examples of the nature and fabrication of appropriate metal bonding layers are set forth in co-pending and commonly assigned application Ser. No. 11/428,158 filed Jun. 30, 2006 for "Nickel-Tin Bonding System for Semiconductor Wafers and Devices;" and Ser. No. 11/534,317 filed Sep. 22, 2006 for "Modified Gold-Tin System with Increased Melting Temperature for Wafer Bonding." The contents of these are incorporated entirely here by reference and it will be understood that these are illustrative, rather than limiting, of the claimed invention.

The diode 10 includes a first transparent ohmic contact 20 to the active structure 11 adjacent the conductive carrier substrate 14. A second transparent ohmic contact 21 is on the active structure 11 opposite from the conductive carrier substrate 14. A third ohmic contact 22 is made to the opposite side of the conductive carrier substrate 14 and completes the basic structure.

As used herein, the term "transparent" refers to an ohmic contact that will transmit at least about 70 percent of incident light of the frequencies generated by the diode 10 and preferably 90-100 percent of such light.

The most common material for a transparent ohmic contact to group three nitride layers (and other semiconductor materials) is indium tin oxide (ITO), and each of the respective ohmic contacts can be formed of indium tin oxide. Other candidate materials include the following: indium tin oxide, nickel oxide, zinc oxide, cadmium tin oxide, titanium tungsten nickel, indium oxide, tin oxide, magnesium oxide, $ZnGa_2O_4$, $SnO_2/Sb$, $Ga_2O_3/Sn$, $AgInO_2/Sn$, $In_2O_3/Zn$, $CuAlO_2$, $LaCuOS$, $CuGaO_2$, and $SrCu_2O_2$. Although the third ohmic contact 22 is not necessarily transparent, it can be made transparent and when transparent can be made from this same group of materials.

FIG. 1 also illustrates that the first and second ohmic contacts 20 and 21 cover substantially all of the relevant portions of the active layer 11. This helps with current spreading, particularly with respect to the p-type layer 12.

The transparent ohmic contacts 20 and 21 (and potentially the ohmic contact 22 to the substrate 14) can also be formed of a plurality of layers of different transparent materials that have different refractive indices. By providing a progressive refractive index through the contact, such a structure minimizes Fresnel loss as light travels through the contact.

A similar advantage can be obtained by an indium tin oxide contact in which the amount of indium is graded through the contact to progressively change the refractive index and minimize Fresnel loss as light travels through the contact.

The diode 10 can also include at least one reflective layer between or adjacent the substrate 14 and the active portion 11. Such a reflective layer can include one of the bonding metals 16 or 17, the substrate itself 14, or additional layers (not shown) adjacent the bonding layers, or even combinations of these reflective layers.

The light emitting diode 10 can also include a lenticular surface illustrated at 23 in the enlarged breakout portion illustration showing a portion of the n-type layer 13 and the second ohmic contact 21.

Exemplary (but not limiting) techniques and resulting lenticular surfaces are set forth in copending and commonly assigned application Ser. No. 11/082,470 filed Mar. 17, 2005 for "High Efficiency Group III Nitride LED with Lenticular Surface;" Ser. No. 11/461,018 filed Jul. 31, 2006 for "Method of Forming 3D Features on LEDs For Improved Light Extraction;" and Ser. No. 11/343,180 filed Jan. 30, 2006 for, "Improved External Extraction Light Emitting Diode Based Upon Crystallographic Faceted Surfaces." The contents of each of these applications are incorporated entirely herein by reference. As respectively indicated therein, such lenticular surfaces can be generated with an embossing technique or chemically developed. Such lenticular surfaces are sometimes referred to as being "roughened" or "textured" surfaces.

In typical embodiments, the diode 10 includes a bond pad 24 to the second transparent ohmic contact 21. In turn, the bond pad 24 can also include a reflective layer 25 that reflects light away from the bond pad.

Although reflecting the light back into the active layers has some disadvantages (because these layers absorb photons for reasons directly related to their emission of photons), the bond pad 24 is typically the part of the diode that is most highly absorbing of emitted photons. Thus, reflecting photons from the bond pad 24 almost always increases light extraction.

FIG. 1 further illustrates that the diode 10 can optionally include a passivation layer indicated by the dotted section at 26. Silicon nitride is an exemplary passivation structure as are combinations of silicon nitride and silicon dioxide ($SiO_2$) or silicon oxynitride. The silicon nitride can be stoichiometric ($Si_3N_4$) or non-stoichiometric, and is preferably sputter-deposited in order to minimize or eliminate hydrogen from being incorporated in the layer. Generally speaking, the presence of hydrogen adversely affects the characteristics of some Group III nitride layers. As illustrated by the enlarged section, the passivation layer 26 can optionally include a lenticular surface 27.

As FIG. 1 illustrates, environmental protection represents at least one of the reasons for including the passivation layer 26. Thus, the passivation layer 26 covers substantially all of the second ohmic contact 21.

Figure 2:
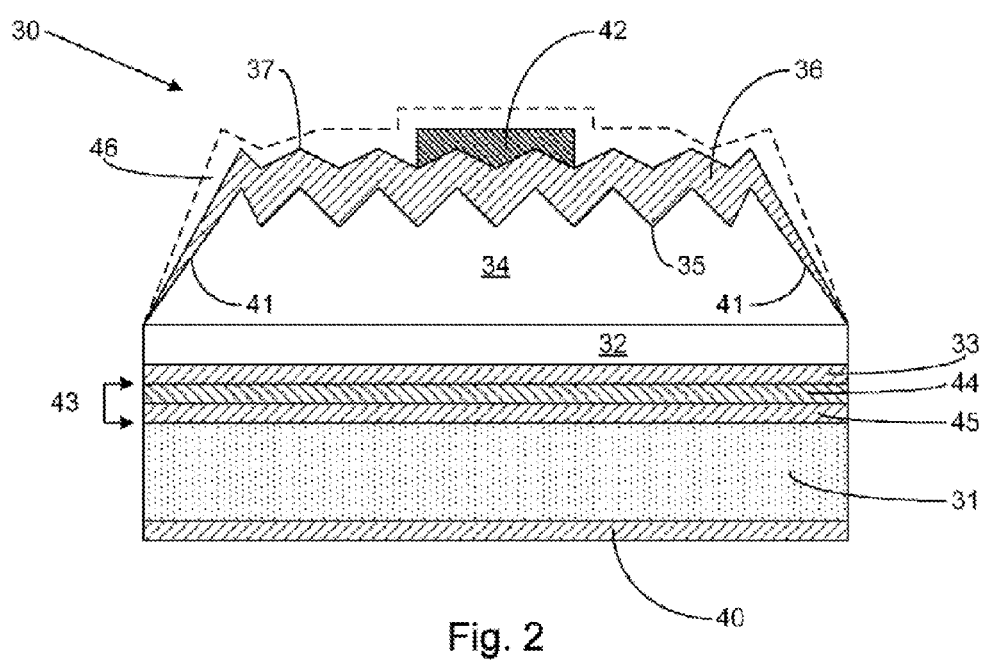

FIG. 2 shows a second embodiment of a light emitting diode according to the invention broadly designated at 30. The diode 30 includes a conductive carrier substrate 31 with a p-type epitaxial Group III nitride layer 32 on the conductive carrier substrate 31.

As used herein, the term "on" refers to the relative positions of elements in the diode. Although the meaning will be clear in context, particularly when taken in conjunction with the drawings, the description of a layer being "on" another layer can include situations in which the layers touch, or in which they are above and below one another. Where required for clarity, layers that touch will be described as such, but generally the structure will be clear in context.

A first transparent ohmic contact 33 provides electrical contact between the p-type layer 32 and the conductive carrier substrate 31. An n-type gallium nitride epitaxial layer 34 is on the p-type gallium nitride layer 32. The n-type layer 34 has a lenticular surface 35.

A second transparent ohmic contact 36 substantially covers the entire n-type epitaxial layer 34 and the lenticular surface 35. The second transparent ohmic contact 36 also forms a lenticular surface 37 opposite the n-type epitaxial layer 34. The lenticular surface 37 (all in the epitaxial layer 34) can be the same as (i.e., conforming to) the lenticular surface of the epitaxial layer, or it can be different from the lenticular surface 35.

The same relationships can apply when the emitting portion of the diode is p-type; i.e., the p-type layer of Group III nitride can include the lenticular surface with the transparent metal ohmic contact on the lenticular p-type layer also having a lenticular surface. In the same manner, the lenticular surface of the ohmic contact can either be the same as (i.e., conforming to) the lenticular surface of the epitaxial layer, or it can have a different lenticular pattern.

The transparent ohmic contacts 33 and 36 can have any of the characteristics referred to with respect to FIG. 1, and are selected from the same groups of materials. As in the first embodiment, the contacts can potentially include a plurality of layers that progress in their respective refractive indices or an ITO layer graded with respect to the atomic fraction of indium.

A third ohmic contact 40 is on the conductive carrier substrate opposite from the Group III nitride layers 34 and 32.

The embodiment illustrated in FIG. 2 includes beveled sidewalls 41 that help increase the external extraction of light from the epitaxial layers. Such shaping is set forth in detail in parent application Ser. No. 11/338,918. Although the shaping of the substrate can include a variety of geometry choices, a straightforwardly beveled sidewall as indicated in FIG. 2 is appropriate in many circumstances As in the first embodiment, the diode 30 can include a bond pad 42 in electrical contact with the second transparent ohmic contact 36. Although not illustrated in FIG. 2, the bond pad 42 can also include a reflective layer or reflective surface to minimize or eliminate the absorption of light by the bond pad 42.

A bonding system shown by the brackets 43 joins the epitaxial layers 34 and 32 with the conductive carrier substrate 31. Two metal bonding layers 44 and 45 are illustrated. As in the case of the first embodiment, however, it will be understood that in some cases the ohmic layer 33 could serve to join the substrate 31 to the epitaxial layers 32 and 34, or that in other cases the bonding system could be other than a metal provided it was sufficiently conductive. Similarly, the bonding structure 43 can be limited to a single layer, or it can include a plurality of layers.

As in the first embodiment, the diode 30 can include a reflective layer or reflective surface typically selected from the group consisting of one of the bonding metal layers 44 or 45 or the conductive carrier substrate 31.

In a manner similar to the conductive carrier substrate 14 shown in FIG. 1, the conductive carrier substrate 31 can comprise a material that is suitable for the structure and function of the diode, but is most typically selected from the group consisting of silicon, silicon carbide, gallium arsenide and metals As in the earlier embodiment, the diode 30 illustrated in FIG. 2 includes a passivation layer 46 that covers the second transparent ohmic contact 36 and the bond pad 42. Exemplary compositions for the passivation layer 46 includes silicon nitride (both stoichiometric and nonstoichiometric, potentially silicon dioxide, and in some cases advantageous combinations of layers of silicon nitride and silicon dioxide.

Figure 3:
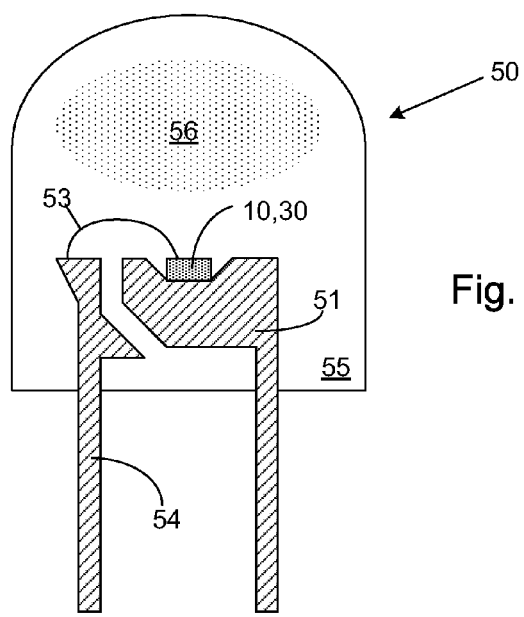
FIG. 3 is a cross-sectional schematic view of a light emitting diode lamp according to the present invention.

FIG. 3 is a schematic diagram of a light emitting diode lamp 50 according to the present invention. The lamp 50 includes a light emitting diode according to the invention which can include either of the embodiments 10 or 20 described with respect to FIGS. 1 and 2.

The diode 10 is positioned on a header 51 which forms a mechanical support and electrical contact to the diode 10. The header 51 also acts as an electrode for the lamp 50. A wire 53 provides electrical contact to a second electrode 54.

The term "header" is used in a broad sense to describe an appropriate electromechanical support for an LED in the context of a lamp.

An encapsulant 55 covers the LED 10 and portions of the header 51 and the electrode 54. The encapsulant 55 provides a lens for the lamp 50, and also provides environmental protection to the diode 10. The encapsulant can be any material that is suitable for the purposes of the invention and that does not otherwise interfere with the operation of the LED chip or the other elements of the lamp. As set forth in co-pending and commonly assigned application Ser. No. 60/824,385 filed Sep. 1, 2006 for, "Phosphor Position In Light Emitting Diodes," when the LED chip emits in the higher energy portions of the spectrum (e.g., blue, violet, and ultraviolet), the encapsulant should be less reactive or inert to the photons emitted at such frequencies. Thus, polysiloxane ("silicone") resins tend to be particularly well suited for the encapsulant. In general, the term polysiloxane refers to any polymer constructed on a backbone of —(—Si—O—)$_n$— (typically with organic side groups). The term "resin" is used in a broad sense to refer to any polymer, copolymer or composite from which the package can be formed. These materials are generally well understood by those of ordinary skill in the art and need not be discussed in detail.

As set forth earlier, in certain embodiments, the encapsulant contains a phosphor indicated by the shaded portion 56 which typically down-converts the light emitted by the diode 10. Most typically, because the Group III nitride material system emits in the blue portion of the spectrum, the phosphor 56 responds to the blue frequencies and emits primarily (although not exclusively) in the yellow portion of the visible spectrum. The combination of the blue light from the diode 10 and the yellow light from the phosphor 56 produces an external emission of white light. Cerium-doped yttrium aluminum garnet (YAG) is an exemplary phosphor for this purpose.

Figure 4:
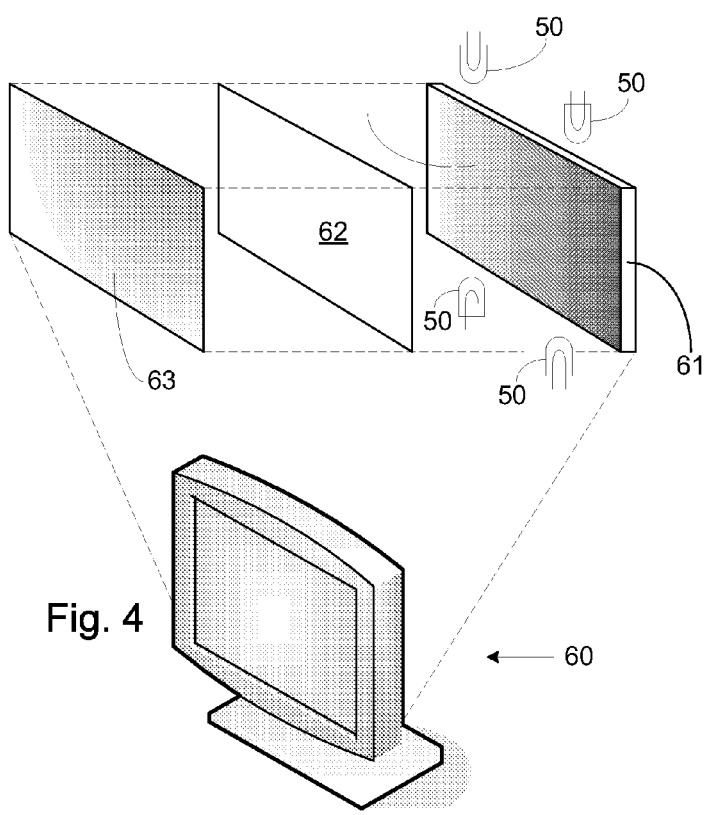
FIG. 4 is a partially exploded schematic view of a display that incorporates diodes and diode lamps according to the present invention.

FIG. 4 illustrates that several lamps 50 according to the invention can be incorporated into a display broadly designated at 60. The nature and operation of various displays is generally well-understood and will not be described in detail herein other than to point out that they typically include the diode lamp 50 and a light distributor 61 which both diffuses light in its main plane, and also redirects some of the light perpendicularly to its main plane.

In many circumstances, the display will also include a set of liquid crystals schematically designated by the rectangle 62, and an appropriate set of one or more color filters schematically illustrated by the single rectangle 63. Other elements can be included in the display, but are omitted here for the sake of clarity. The liquid crystals generally operate in and "on" or "off" orientation when a signal is applied to them, so that in combination with the color filters 63 the display 60 produces a color image.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
    an active structure comprising p-type and n-type epitaxial layers of Group III nitride, wherein the active structure comprises a first lenticular surface;
    an electrically conductive carrier substrate;
    an electrically conductive bonding system joining said active structure to said electrically conductive carrier substrate;
    a first transparent ohmic contact to said active structure, said first transparent ohmic contact between said active structure and said electrically conductive carrier substrate;
    a second transparent ohmic contact in direct contact with said active structure, without any layer in between said active structure and said second transparent ohmic contact, said active structure between said second transparent ohmic contact and said electrically conductive carrier substrate; and
    a third ohmic contact to said electrically conductive carrier substrate, said electrically conductive carrier substrate between said third ohmic contact and said active structure,
    wherein said second transparent ohmic contact comprises a second lenticular surface opposite the first lenticular surface of the active structure.

2. A light emitting diode according to claim 1 wherein said Group III nitride epitaxial layers are selected from the group consisting of gallium nitride and indium gallium nitride.

3. A light emitting diode according to claim 1 wherein said first transparent ohmic contact and said second transparent ohmic contact comprise indium tin oxide.

4. A light emitting diode according to claim 1 wherein said first transparent ohmic contact and said second transparent ohmic contact are selected from the group consisting of: indium tin oxide, nickel oxide, zinc oxide, cadmium tin oxide, titanium tungsten nickel, indium oxide, tin oxide, magnesium oxide, $ZnGa_2O_4$, $SnO_2/Sb$, $Ga_2O_3/Sn$, $AgInO_2/Sn$, $In_2O_3/Zn$, $CuAlO_2$, $LaCuOS$, $CuGaO_2$, and $SrCu_2O_2$.

5. A light emitting diode according to claim 1 wherein said electrically conductive bonding system comprises at least one metal layer.

6. A light emitting diode according to claim 1 further comprising at least one reflective layer selected from the group consisting of: a bonding layer; said electrically conductive carrier substrate; additional layers adjacent said bonding layer; and combinations thereof.

7. A light emitting diode according to claim 1 wherein said third ohmic contact to said electrically conductive carrier substrate is transparent.

8. A light emitting diode according to claim 7 wherein said third ohmic contact is selected from the group consisting of indium tin oxide, nickel oxide, zinc oxide, cadmium tin oxide, titanium tungsten nickel, indium oxide, tin oxide, magnesium oxide, $ZnGa_2O_4$, $SnO_2/Sb$, $Ga_2O_3/Sn$, $AgInO_2/Sn$, $In_2O_3/Zn$, $CuAlO_2$, $LaCuOS$, $CuGaO_2$, and $SrCu_2O_2$.

9. A light emitting diode according to claim 1 further comprising a bond pad to said second transparent ohmic contact.

10. A light emitting diode according to claim 9 further comprising a reflective layer between said bond pad and said second transparent ohmic contact for reflecting light off said bond pad.

11. A light emitting diode according to claim 1 wherein at least one of said first transparent ohmic contact and said second transparent ohmic contact comprises a plurality of layers that progress in refractive index with respect to one another to minimize Fresnel loss as light travels through said first transparent ohmic contact and said second transparent ohmic contact.

12. A light emitting diode according to claim 1 wherein at least one of said first transparent ohmic contact and said second transparent ohmic contact comprises indium tin oxide in which the amount of indium is graded through the contact to progressively change the refractive index and minimize Fresnel loss as a light travels through said first transparent ohmic contact and said second transparent ohmic contact.

13. A light emitting diode according to claim 1 further comprising a passivation layer on said second transparent ohmic contact.

14. A light emitting diode according to claim 13 wherein said passivation layer is selected from the group consisting of silicon nitride, silicon dioxide and silicon oxynitride and covers said second transparent ohmic contact and said active structure.

15. A light emitting diode according to claim 13 wherein said passivation layer comprises stoichiometric silicon nitride.

16. A light emitting diode comprising:
an electrically conductive carrier substrate;
a p-type epitaxial layer on said electrically conductive carrier substrate;
a first transparent ohmic contact between said p-type layer and said electrically conductive carrier substrate;
an n-type epitaxial layer on said p-type layer;
a lenticular surface on said n-type epitaxial layer;
a second transparent ohmic contact covering said n-type epitaxial layer and said lenticular surface;
said second transparent ohmic contact forming a lenticular surface opposite said n-type epitaxial layer; and
a third ohmic contact to said electrically conductive carrier substrate opposite from said epitaxial layers
wherein said first transparent ohmic contact comprises a second lenticular surface opposite the first lenticular surface of the active structure.

17. A light emitting diode according to claim 16 wherein said third ohmic contact to said electrically conductive carrier substrate is transparent.

18. A light emitting diode according to claim 17 wherein said third ohmic contact is selected from the group consisting of: indium tin oxide, nickel oxide, zinc oxide, cadmium tin oxide, titanium tungsten nickel, indium oxide, tin oxide, magnesium oxide, $ZnGa_2O_4$, $SnO_2$/Sb, $Ga_2O_3$/Sn, $AgInO_2$/Sn, $In_2O_3$/Zn, $CuAlO_2$, LaCuOS, $CuGaO_2$, and $SrCu_2O_2$.

19. A light emitting diode according to claim 16 wherein at least one of said first transparent ohmic contact and said second transparent ohmic contact are selected from the group consisting of: indium tin oxide, nickel oxide, zinc oxide, cadmium tin oxide, titanium tungsten nickel, indium oxide, tin oxide, magnesium oxide, $ZnGa_2O_4$, $SnO_2$/Sb, $Ga_2O_3$/Sn, $AgInO_2$/Sn, $In_2O_3$/Zn, $CuAlO_2$, LaCuOS, $CuGaO_2$, and $SrCu_2O_2$.

20. A light emitting diode according to claim 16 further comprising a bond pad to said second transparent ohmic contact.

21. A light emitting diode according to claim 16 further comprising bonding layers between said first transparent ohmic contact and said electrically conductive carrier substrate.

22. A light emitting diode according to claim 21 wherein said bonding layers comprise at least one metal layer.

23. A light emitting diode according to claim 22 further comprising a reflective layer selected from the group consisting of one of said bonding metal layers and said electrically conductive carrier substrate.

24. A light emitting diode according to claim 16 wherein said electrically conductive carrier substrate is selected from the group consisting of silicon, silicon carbide, gallium arsenide and metals.

25. A light emitting diode according to claim 16 further comprising a passivation layer covering said second transparent ohmic contact.

26. A light emitting diode according to claim 25 wherein said passivation layer comprises silicon nitride.

27. A light emitting diode according to claim 16 wherein at least one of said first transparent ohmic contact and said second transparent ohmic contact comprises a plurality of layers of transparent material with progressing indexes of refraction for minimizing Fresnel loss as light passes through said first transparent ohmic contact and said second transparent ohmic contact.

28. A light emitting diode according to claim 16 wherein at least one of said first transparent ohmic contact and said second transparent ohmic contact comprises a layer of indium tin oxide in which the content of indium is progressively graded across the contact to minimize Fresnel loss as light passes through said first transparent ohmic contact and said second transparent ohmic contact.

29. A light emitting diode comprising:
an active structure comprising p-type and n-type epitaxial layers of Group III nitride, the active structure comprising a lenticular surface;
an electrically conductive carrier substrate;
an electrically conductive bonding system joining said active structure to said electrically conductive carrier substrate;
a first transparent ohmic contact to said active structure;
a second transparent ohmic contact in direct contact with said lenticular surface of said active structure, without any layer in between said active structure and said second transparent ohmic contact, said active structure between said second transparent ohmic contact and said electrically conductive carrier substrate, wherein said second transparent ohmic contact comprises a progressive refractive index; and
a third ohmic contact to said electrically conductive carrier substrate, said electrically conductive carrier substrate between said third ohmic contact and said active structure.

30. In a light emitting diode that includes an electrically conductive carrier substrate and a Group III nitride active portion, the improvement comprising:
an n-type layer of Group III nitride including a lenticular surface;
a transparent metal ohmic contact in direct contact with said lenticular surface, without any layer in between said lenticular surface and said transparent metal ohmic contact, in which the transparent metal ohmic contact comprises a progressive refractive index; and
an electrically conductive bonding system between the electrically conductive carrier substrate and the Group III nitride active portion.

31. A light emitting diode according to claim 1, wherein said first transparent ohmic contact is adjacent to said active structure.

32. A light emitting diode according to claim 16, wherein said second transparent ohmic contact is adjacent to said n-type epitaxial layer.

33. A light emitting diode according to claim 29, wherein said first transparent ohmic contact is adjacent to said active structure.

34. A light emitting diode according to claim 29, wherein said electrically conductive bonding system comprises at least one metal layer.

35. A light emitting diode according to claim 29, wherein said electrically conductive bonding system comprises a first metal layer and second metal layer.

36. A light emitting diode according to claim 29, wherein said second transparent ohmic contact includes a lenticular surface.

37. A light emitting diode according to claim 29, wherein said n-type epitaxial layer includes a lenticular surface.

38. A light emitting diode according to claim 29, further comprising:
a bond pad to said second transparent ohmic contact.

39. A light emitting diode according to claim 38, wherein said bonding pad includes a reflective layer.

40. A light emitting diode according to claim 29, further comprising:
a passivation layer on said second transparent ohmic contact.

41. A light emitting diode according to claim 30, further comprising:
a bond pad to said transparent metal ohmic contact.

42. A light emitting diode according to claim 30, further comprising:
a passivation layer on said transparent metal ohmic contact.

43. A light emitting diode according to claim 30, further comprising:
a p-type layer of Group III nitride; and
a second metal ohmic contact in direct contact with said p-type layer, without any layer in between said p-type layer and said second metal ohmic contact.

44. A light emitting diode according to claim 30, wherein said electrically conductive bonding system comprises a conductive bonding metal.

45. A light emitting diode according to claim 30, further comprising:
a third metal ohmic contact in direct contact with said electrically conductive carrier substrate, without any layer in between said electrically conductive carrier substrate and said third metal ohmic contact.

46. A light emitting diode according to claim 30, further comprising:
a reflective layer on said transparent metal ohmic contact; and
a bond pad on said reflective layer.

* * * * *